(12) United States Patent
Ahn et al.

(10) Patent No.: US 8,812,886 B2
(45) Date of Patent: Aug. 19, 2014

(54) DYNAMIC UTILIZATION OF POWER-DOWN MODES IN MULTI-CORE MEMORY MODULES

(75) Inventors: Jung Ho Ahn, Menlo Park, CA (US); Norman P. Jouppi, San Mateo, CA (US); Jacob B. Leverich, San Mateo, CA (US); Robert S. Schreiber, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 862 days.

(21) Appl. No.: 13/058,067

(22) PCT Filed: Aug. 13, 2008

(86) PCT No.: PCT/US2008/009735
§ 371 (c)(1),
(2), (4) Date: Feb. 8, 2011

(87) PCT Pub. No.: WO2010/019119
PCT Pub. Date: Feb. 18, 2010

(65) Prior Publication Data
US 2011/0138387 A1 Jun. 9, 2011

(51) Int. Cl.
*G06F 1/32* (2006.01)
*G06F 12/02* (2006.01)
*G06F 13/16* (2006.01)
*G11C 5/04* (2006.01)
*G11C 7/20* (2006.01)

(52) U.S. Cl.
CPC ......... *G06F 12/0215* (2013.01); *Y02B 60/1239* (2013.01); *G06F 1/3203* (2013.01); *G06F 13/1694* (2013.01); *G06F 2212/1028* (2013.01); *G11C 5/04* (2013.01); *G11C 7/20* (2013.01)
USPC ............................................ 713/323; 713/320

(58) Field of Classification Search
CPC ........................ Y02B 60/1225; Y02B 60/1239
USPC ................ 713/320, 322–324; 718/1; 711/129
See application file for complete search history.

(56) References Cited

U.S. PATENT DOCUMENTS

2005/0138442 A1  6/2005  Keller, Jr. et al.
2005/0144403 A1  6/2005  Jeddeloh
(Continued)

FOREIGN PATENT DOCUMENTS

JP    2001175532    6/2001
WO   WO-2007095080  8/2007

OTHER PUBLICATIONS

Delaluz, V. et al. 'DRAM Energy Management Using Software and Hardware Directed Power Mode Control.' In: The Seventh International Symposium on High-Performance Computer Architecture IEEE 201, pp. 159-169.
International Search Report, PCT/US2008/009735, 10 pages.

(Continued)

*Primary Examiner* — Glenn A Auve

(57) ABSTRACT

Various embodiments of the present invention are directed to methods that enable a memory controller to choose a particular operation mode for virtual memory devices of a memory module based on dynamic program behavior. In one embodiment, a method for determining an operation mode for each virtual memory device of a memory module includes selecting a metric (1001) that provides a standard by which performance and/or energy efficiency of the memory module is optimized during execution of one or more applications on a multicore processor. For each virtual memory device (1005), the method also includes collecting usage information (1006) associated with the virtual memory device over a period of time, determining an operation mode (1007) for the virtual memory device based on the metric and usage information, and entering the virtual memory device into the operation mode (1103, 1105, 1107, 1108).

15 Claims, 13 Drawing Sheets

(56) References Cited

U.S. PATENT DOCUMENTS

| | | |
|---|---|---|
| 2006/0018179 A1 | 1/2006 | Marchal et al. |
| 2008/0031030 A1 | 2/2008 | Rajan et al. |
| 2011/0145504 A1* | 6/2011 | Anh et al. .................... 711/129 |

OTHER PUBLICATIONS

Thoziyoor, S. et al. 'A Comprehensive Memory Modeling Tool and Its Application to the Design and Analysis of Future Memory Hierarchies.' In: 35th International Symposium on Computer Architecture IEEE 2008 vol. 36 Issue 3 pp. 51-62.

* cited by examiner

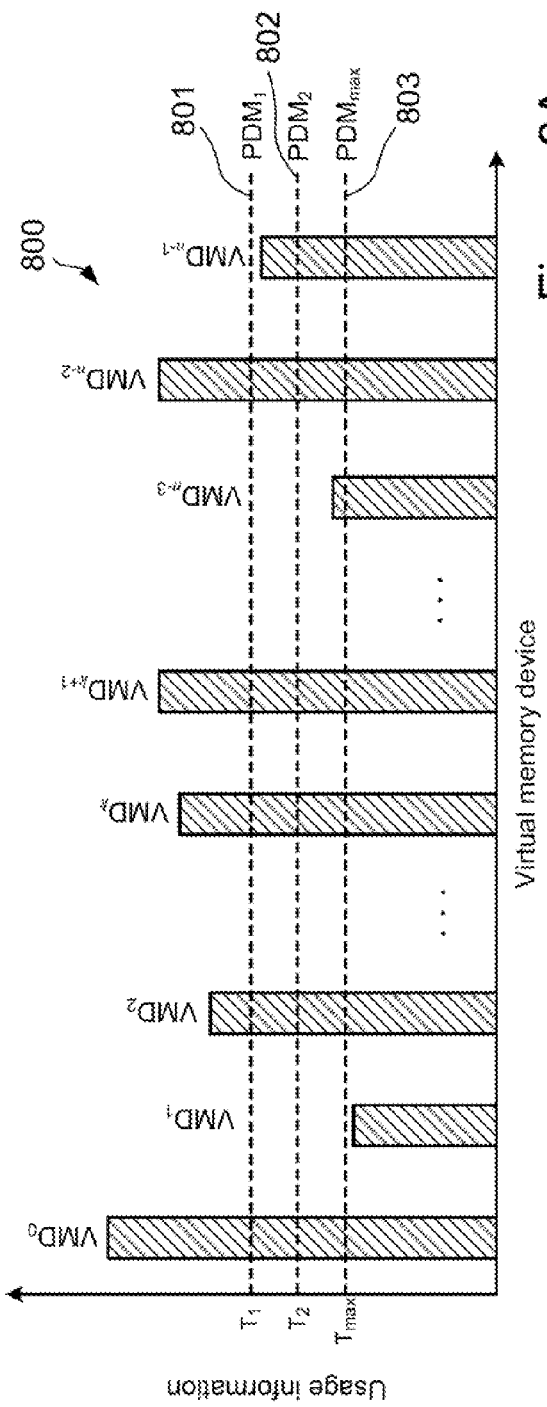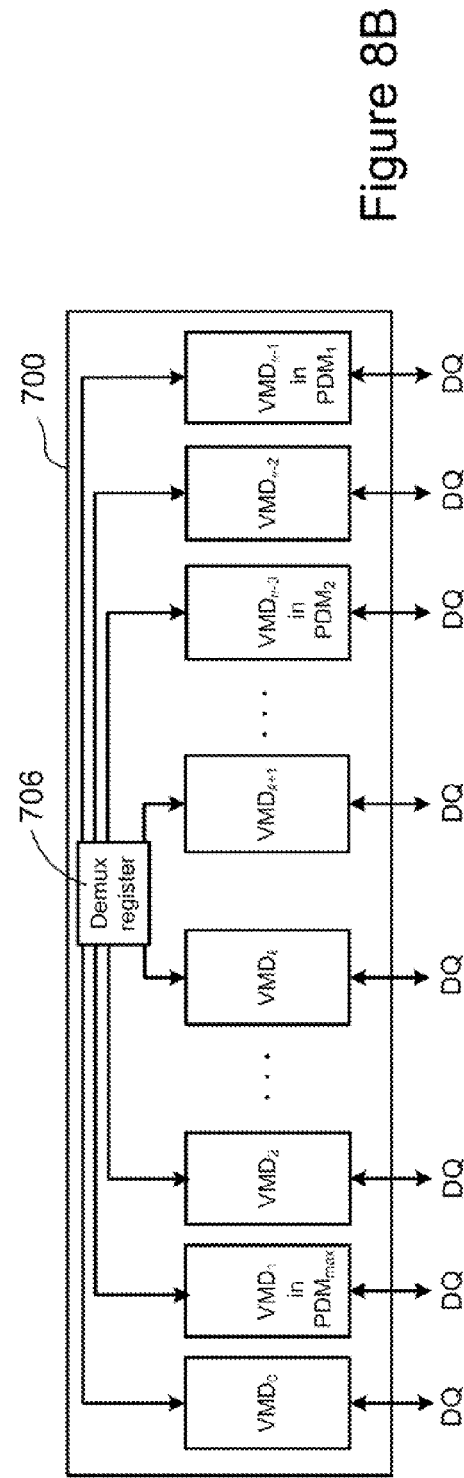

DYNAMIC UTILIZATION OF POWER-DOWN MODES IN MULTI-CORE MEMORY MODULES

TECHNICAL FIELD

Embodiments of the present invention are directed to memory modules, and, in particular, to methods for entering independent virtual memory devices of a memory module into different operation modes based on dynamic operation of a program.

BACKGROUND

In modern computer systems, demand for memory capacity and bandwidth keeps growing. Recent performance scaling of microprocessors relies on increasing the number of cores per chip, and multi-core and many core chip multiprocessors ("CMP") demand even higher memory bandwidth and capacity through multiple memory controllers per processor. So the power budget of main memory modules becomes similar to or even higher than that of processors in current computer systems.

However, typical memory modules are energy inefficient. For example, the standby energy of memory modules is a significant portion of total main memory energy usage when multiple memory modules are connected to a memory controller of a processor. When the memory modules are not actively responding to a memory request, most of the memory modules are idle using standby energy while they wait for the next memory request, which is an inefficient use of energy. Multiple power-down modes are provided in many current memory chips to save standby energy, and both system-software and hardware use these power-down modes to save standby energy. However, the amount of power saving is limited since the same power-down mode must be applied to all memory chips within the module.

Memory systems and methods enabling access to information stored in the memory system that saves energy without significantly sacrificing system performance are desired.

SUMMARY

Various embodiments of the present invention are directed to methods that enable a memory controller to choose a particular operation mode for virtual memory devices of a memory module based on dynamic program behavior. In one embodiment, a method for determining an operation mode for each virtual memory device of a memory module includes selecting a metric that provides a standard by which performance and/or energy efficiency of the memory module is optimized during execution of one or more applications on a multicore processor. For each virtual memory device, the method also includes collecting usage information associated with the virtual memory device over a period of time, determining an operation mode for the virtual memory device based on the metric and usage information, and entering the virtual memory device into the operation mode.

BRIEF DESCRIPTION OF THE DRAWINGS

FIG. 8A shows a bar graph presenting usage information for each of the virtual memory devices of the multi-core dual in-line memory modules shown in FIG. 7 in accordance with embodiments of the present invention.

FIG. 8B shows three virtual memory devices of the multi-core dual in-line memory module shown in FIG. 7 in different energy-saving modes in accordance with embodiments of the present invention.

DETAILED DESCRIPTION

Various embodiments of the present invention are directed to methods that enable a memory controller to choose a particular operation mode for memory chips of a memory module based on dynamic program behavior. For example, a memory controller can be configured to enter certain memory chips receiving numerous memory requests over a time period into standby mode so that when these memory chips are not in use they can quickly respond to a memory request. In contrast, the memory controller can also enter other memory chips experiencing relatively lower activity over the same time period into one of many energy-saving modes. Method embodiments are flexible in that system performance can be balanced with energy efficiency. The term "performance" refers to the amount of work a memory system executes over a period of time. Latency, response time, and bandwidth are metrics that can be used to compare a memory system's performance before and after changes to the memory system or to other memory systems. Method embodiments allow performance to be given higher priority than energy efficiency by directing the memory controller to enter fewer memory chips into energy-saving modes than the memory controller would enter into energy-saving modes when energy efficiency is given higher priority than performance.

Method embodiments of the present invention can be applied to conventional memory modules and to multi-core memory modules, which are designed to improve the energy efficiency of memory systems with small impact on system performance. A multi-core memory module includes memory chips that are partitioned into groups of one or more memory chips called "virtual memory devices" ("VMDs"). The memory chips can be dynamic random access memory ("DRAM") chips.

The detailed description is organized as follows. A general description of conventional memory modules are described in a first subsection. A description of multicore memory modules are described in a second subsection. Method embodiments of the present invention are described in a third subsection.

Memory Modules

Figure 1A:
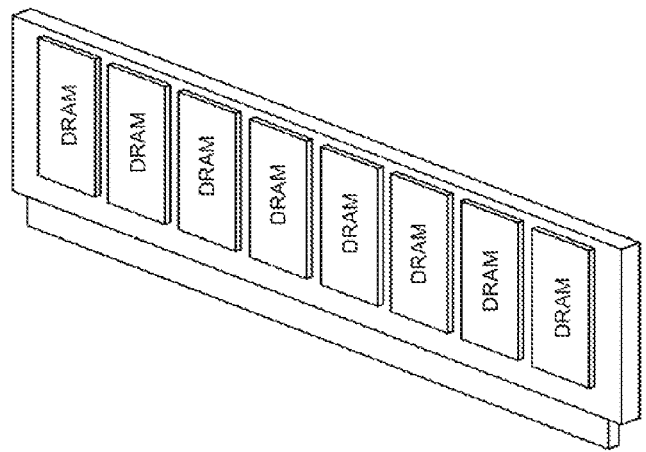
FIG. 1A shows an isometric view of a memory module with eight memory chips.
Figure 1B:
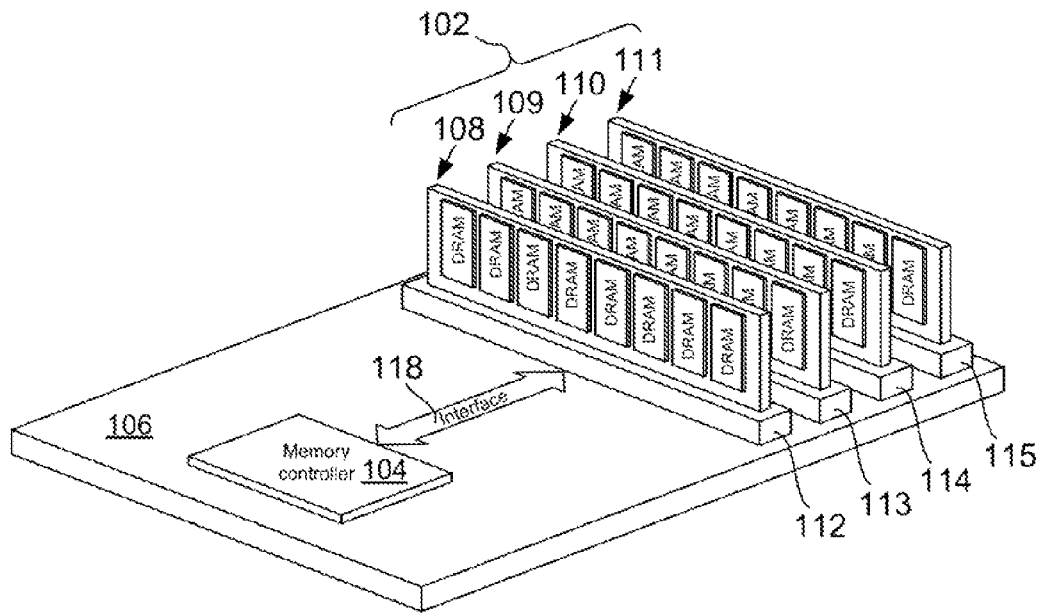
FIG. 1B shows an isometric view of memory modules and a memory controller mounted on circuit board.

Memory modules are typically comprised of several DRAM chips mounted on a printed circuit board forming a storage unit called a "dual-in-line memory module" ("DIMM"). FIG. 1A shows an isometric view of a single DIMM comprising eight DRAM chips. One or more DIMMs are then mounted on a circuit board and controlled by a memory controller. FIG. 1B shows an isometric view of memory 102 and a memory controller 104 mounted on circuit board 106. The memory 102 is composed of four DIMMs 108-111 inserted into four DIMM slots 112-115. The memory controller 104 is a computer chip or part of a multi-core microprocessor chip, which manages the flow of commands and data sent to and from the DIMMs 108-111 and interfaces the memory 102 with other major components of a computer system, such as the central processing unit. Each DIMM is in electrical communication with the memory controller 104 via an interface 118. The interface 118 is a bus that carries the clock signal and commands from the memory controller 104 to the memory 102 and data signals between the DIMMs 108-111 and the memory controller 104. Data signals are sent in parallel between the memory controller 104 and DRAM chips in the DIMMs 108-111. The interface 118 can support single-data rate ("SDR"), double-data rate ("DDR"), and higher data rate transfers. SDR refers to transmitting data once per clock cycle, and DDR refers to transmitting data on both the rising and falling edges of the computer system clock signal. The memory controller 104 and the DIMMs 108-111 can be configured to transmit and receive data in accordance with SDR and DDR. By using both edges of the clock in DDR, the data signals operate at the same limiting frequency, doubling the data transmission rate over single-data rate transmissions.

Figure 2:
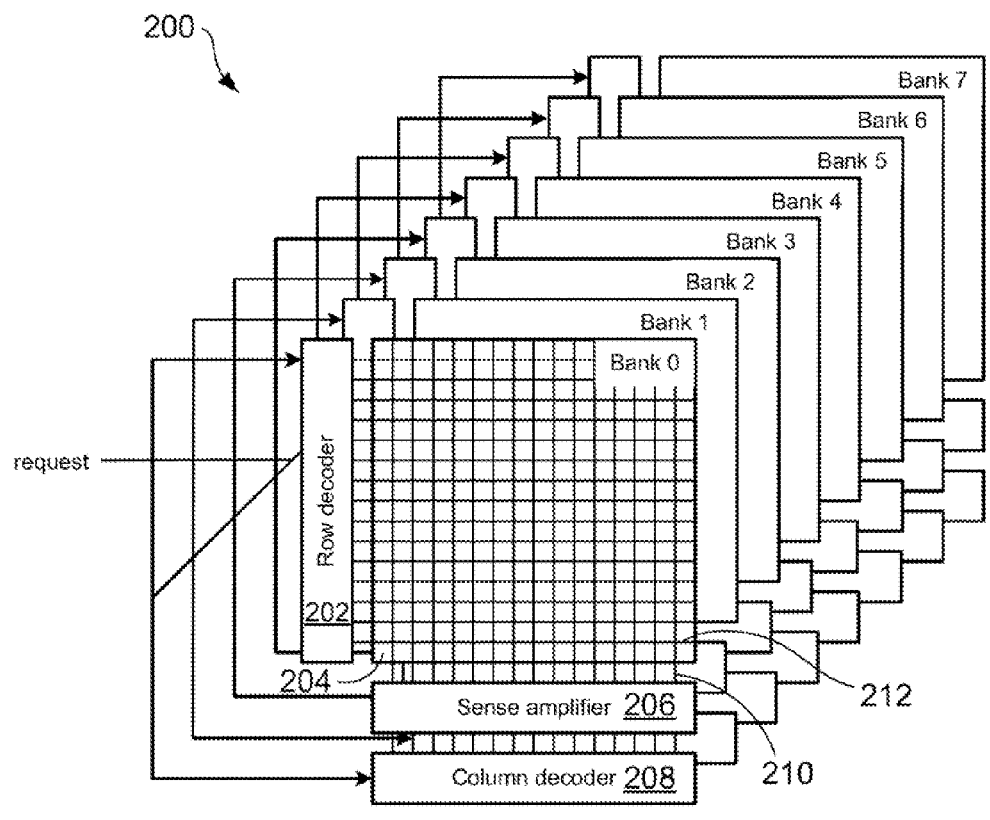
FIG. 2 shows a schematic representation of eight banks comprising a memory chip.

A DRAM chip stores a bit in a structure called a DRAM memory cell consisting of a transistor and a capacitor. There are billions of cells in a single DRAM chip and the cells can be organized in a two-dimensional arrangement of numerous two-dimensional arrays called "banks." FIG. 2 shows a schematic representation of eight banks denoted 0-7 comprising a DRAM chip 200. As shown in the example of FIG. 2, each bank is connected to a row decoder, a sense amplifier, and a column decoder via intersecting signal lines. For example, Bank 0 is connected to row decoder 202 via signal lines running parallel to the x-axis, such as signal line 204. Bank 0 is also connected to sense amplifier 206 and column decoder 208 via signal lines running parallel to the y-axis, such as signal line 210. Memory cells are located at signal line intersections. For example, a memory cell 212 is located at the point where signals 204 and 210 intersect.

The commands sent from the memory controller 104 to the memory 102 include READ, WRITE, ACTIVATE, REFRESH, and PRECHARGE. Commands are composed of control signals and address signals. A control signal represents the operation performed by the command and the address signal identifies the bank and row or column addresses in the DRAM chips where the command is performed. For example, an ACTIVATE command is composed of an activation control signal and bank and row addresses identifying which bank and row within a DRAM chip the ACTIVATE command is performed. READ and WRITE commands are composed of read and write control signals and bank and column addresses identifying in which bank and column in the DRAM chip the READ and WRITE commands are performed.

Data stored in the banks of the DRAM chip 200 is accessed in two steps. First, a memory controller (not shown) sends an ACTIVATE command specifying a row address and a bank addresses of the DRAM chip 200. All bits in the row, which is typically 8 or 16 Kbits of the bank, are activated into sense amplifiers within the bank. Second, one or more READ/WRITE commands specifying the bank and column addresses are sent. The number of bits transferred per READ/WRITE transaction is determined by the size of the data bus and the burst length. The burst length is a common memory-related, basic input/output system setting that controls the number of READ/WRITE operations performed in a single burst transaction or high-speed transmission of data blocks. Typically, the burst length is set to 4 or 8. When a DRAM chip receives, for example, a memory READ request, the chip responds by supplying data across the signal lines of the interface 118. The size of the block of data sent in response to the memory READ request is determined by the burst length. A memory module with a 64 bit wide data bus (i.e., 64 single-ended signal lines or 128 differential signal lines) and DRAM chips configured to support a burst length of 4 sends a data block of 32 bytes (4×64 bits=32 bytes) in response to a single READ request from the memory controller. On the other hand, a memory module with a 64 bit wide data bus and DRAM chips configured to support a burst length of 8 sends a data block of 64 bytes (8×64 bits=64 bytes) in response to a single READ request from the memory controller When data is read in two different rows in the same bank of a DRAM chip, the first row must be written back, the bitlines charged, and the second row latched by the PRECHARGE and ACTIVATE commands before the data in the second row can be read. The PRECHARGE command writes the row back into the DRAM bank, which is necessary because the ACTIVATE command reads destructively. The bank address is given by a small number of bits in the READ, WRITE, ACTIVATE, and PRECHARGE commands. These command operations often take about 50 ns between a first ACTIVATE and a second ACTIVATE command in the same bank. Thus, unless there are many READ/WRITE commands between ACTIVATE and PRECHARGE commands, command/address/data buses often sit idle. However, if data is read in different banks, commands to different banks can be pipelined because the ACTIVATE to ACTIVATE time between two different banks is shorter by about 8 ns. Thus, higher throughput can be achieved by interleaving requests in different banks, especially when there are not many READ/WRITE commands between ACTIVATE and PRECHARGE command pairs.

Figure 3A:
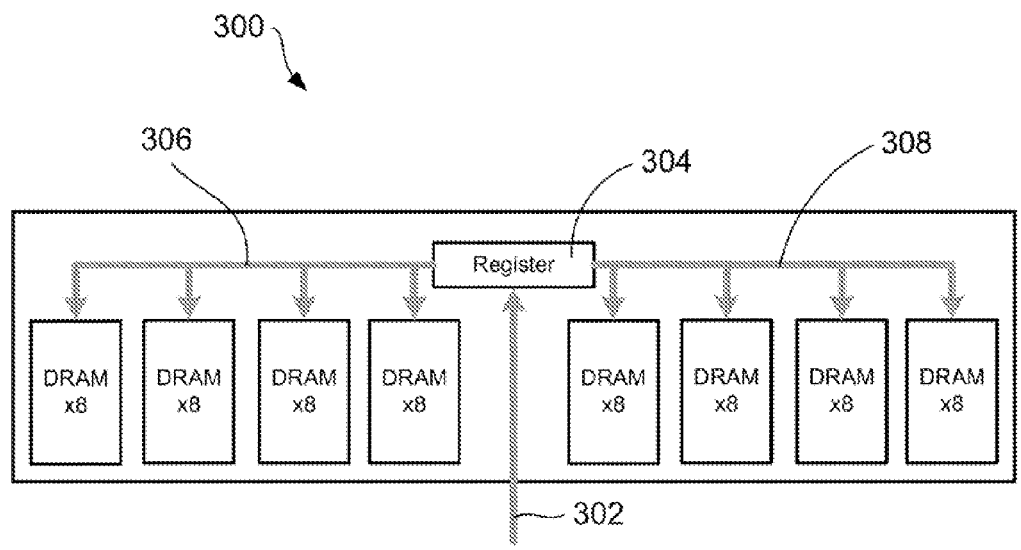
FIG. 3A shows a schematic representation of a conventional memory module.

FIG. 3A shows a schematic representation of a conventional DIMM 300 that includes 8 DRAM chips, each of which has an 8 bit data bus. Directional arrow 302 represents the distribution of commands that are sent from a memory controller (not shown) to an optional device called a register 304. The register 304 is located on a bus between the memory controller and the DRAM chips. The register 304 latches command signals from the memory controller then forwards them with better signal quality and timing margin to each DRAM chip in order to lessen the electrical load on the memory controller and maintain stability of command signals. The register 304 can also buffer commands and broadcast clock signals to DRAM chips to facilitate overlapping access to different DIMMs in systems with multiple DIMMs per memory controller. The register 304 broadcast the commands to all 8 DRAM chips over a bus, as indicated by branching directional arrows 306 and 308. In other conventional memory modules, commands are broadcast to the DRAM chips without the register 304.

Figure 3B:
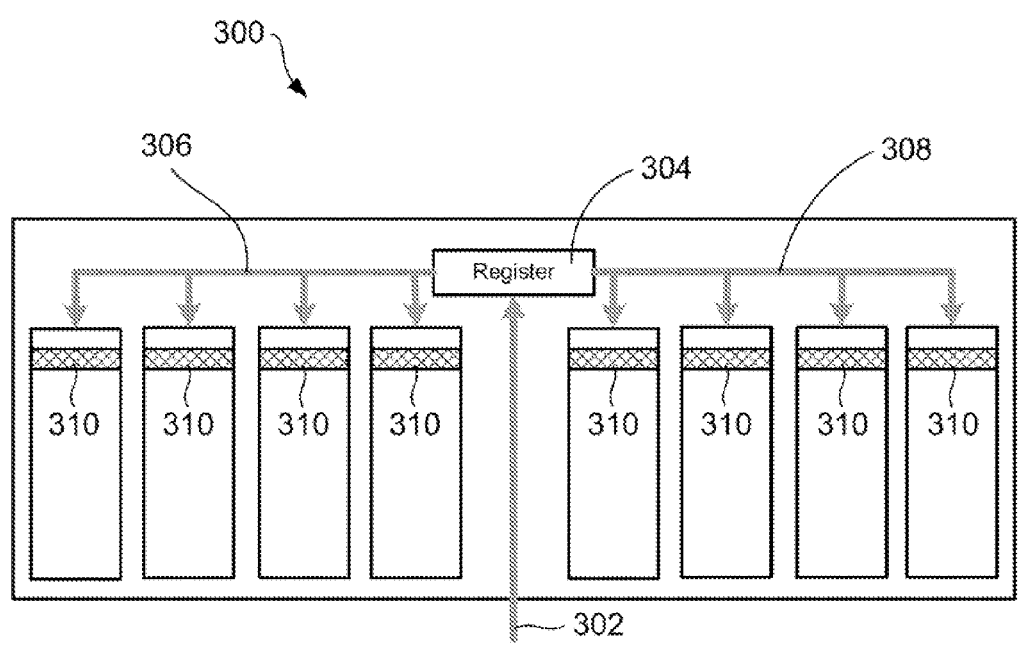
FIG. 3B shows an example of broadcasting a command to all memory chips of a conventional memory module.

FIG. 3B shows an example of a conventional DIMM operation. As shown in the example of FIG. 3B, all of the DRAM chips within the DIMM 300 receive the same commands from the memory controller and activate the same row in each DRAM chip represented by shaded regions 310. As a result, all DRAM chips within the DIMM 300 act as a single DRAM chip with wider data paths and larger rows.

As described above with reference to FIG. 2, the size of a DRAM chip row is typically 8 (or 16 Kbits). In order to read a cache line or write a cache line to a DIMM, the READ/WRITE command is broadcast to all DRAM chips, and each DRAM chip activates the same row. In other words, in a typical DIMM consisting of 8 DRAM chips, each DRAM chip activates the same row address comprising 8 Kbits. Thus 8×8 Kbits or 64 Kbits of DRAM cells of a DIMM are activated at one time, which is larger than the size of the cache line to be read or written. A typical cache line is on the order of 64 bytes or 512 bits. Because a READ/WRITE command DIMMs is typically read or written in cache line granularity, over 99% of the DRAM cells that are activated are unused for a single READ or WRITE transaction, which is an inefficient use of energy.

Multi-Core Memory Modules

Figure 4A:
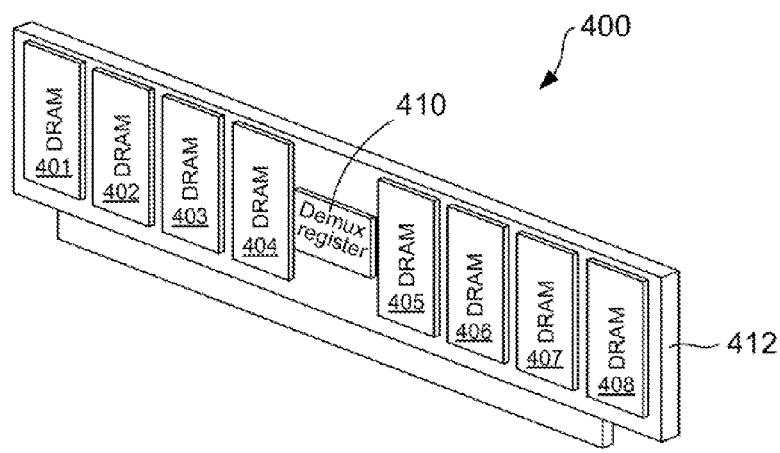
FIG. 4A shows an isometric view of a single multi-core memory module configured in accordance with embodiments of the present invention.

A multi-core memory module comprises a demultiplexer register ("demux register") for receiving commands from a memory controller and memory chips grouped into VMDs that are mounted on a printed circuit board. In certain embodiments, the memory chips can be DRAM chips. FIG. 4A shows an isometric view of a single multi-core dual in-line memory module 400 comprising eight DRAM chips 401-408 and a demux register 410 disposed on circuit board 412 in accordance with embodiments of the present invention. The DRAM chips 401-408 can be grouped into VMDs comprising one or more DRAM chips, examples of which are described in greater detail below.

Figure 4B:
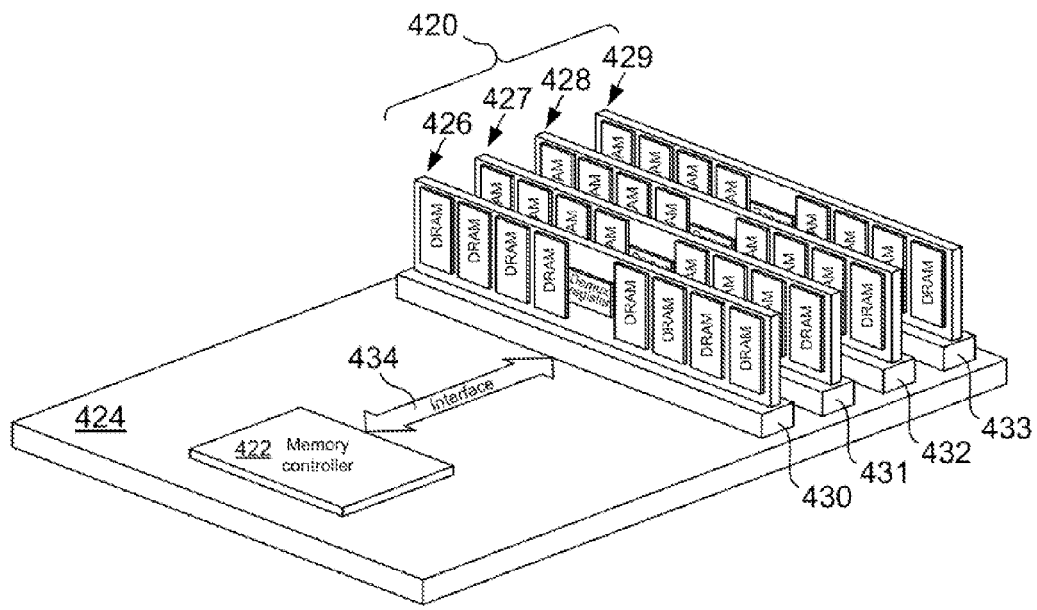
FIG. 4B shows an isometric view of multi-core memory modules and a memory controller mounted on circuit board in accordance with embodiments of the present invention.

Like conventional DIMMs, one or more MCDIMMs can be mounted on a circuit board and controlled by a memory controller. FIG. 4B shows an isometric view of memory 420 and a memory controller 422 mounted on circuit board 424 in accordance with embodiments of the present invention. The memory 420 comprises MCDIMMs 426-429 inserted into DIMM slots 430-433, respectively. The MCDIMM 400 has an interface 434 between the memory controller 422 and the demux registers of the memory modules 426-429. The interface 434 includes a bus that carries command signals from the memory controller 422 to the memory 420 and a data bus that carries data signals between the memory controller 422 and the memory 420. In this architecture, commands sent by the memory controller 422 are not broadcast to the DRAM chips of the memory 420. Instead, the memory controller 420 sends commands to the demux registers of the MCDIMMs 426-429. Each of the MCDIMMs 426-429 includes a command bus that enables a demux register to send the commands directly to the VMDs.

MCDIMMs are compatible with multicore processors. For example, multiple applications can be run concurrently in a multicore processor, where each core runs one multi-threaded application and the memory controllers in the multicore processor serve requests for only one application.

Figure 5A:
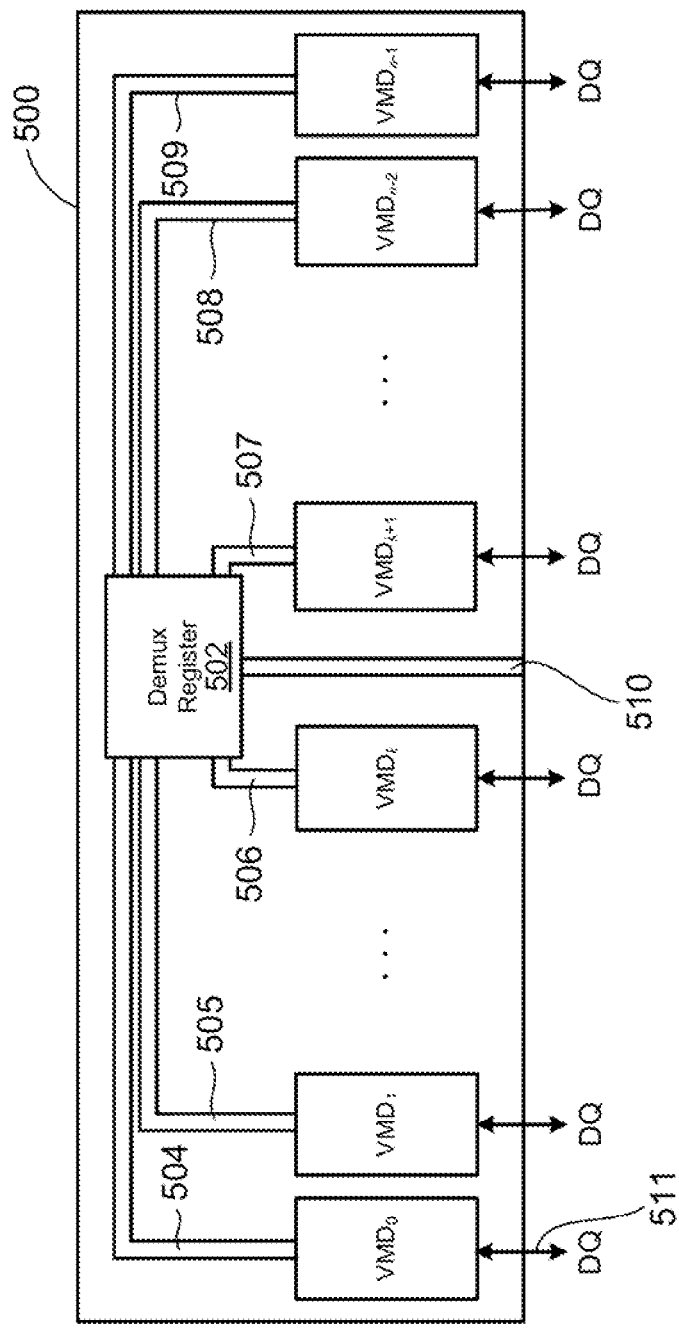
FIGS. 5A-5D show general schematic representations of a multi-core, dual in-line memory module configured in accordance with embodiments of the present invention.

FIG. 5A shows a general schematic representation of a MCDIMM 500 configured in accordance with embodiments of the present invention. The MCDIMM 500 includes n VMDs, where n is an integer representing the number of VMDs in the MCDIMM 500. Eight of the VMDs are represented in FIG. 5A and denoted by $VMD_k$, where the subscript k is an integer ranging from 1 to n. The MCDIMM 500 is configured so that each of the VMDs is connected to a demux register 502 via a separate set of signal lines. Two different embodiments for the demux register 502 are described below with reference to FIGS. 5B and 5C. For example. $VMD_0$, $VMD_1$, $VMD_k$, $VMD_{k+1}$, $VMD_{n-2}$, and $VMD_{n-1}$ are connected to the demux register 502 via sets of signal lines 504-509. The combined set of signal lines connecting the VMDs to the demux register 502 is called a "command bus." Each VMD can be composed of one or more memory chips, such as DRAM chips. Commands sent from a memory controller (not shown) to the MCDIMM 500 arrive at the demux register 502 over a set of signal lines 510 called a "command path." Each of the VMDs exchanges data with the memory controller on a separate data bus identified in FIG. 5A by double headed arrows, such as double headed arrow 511.

Figure 5B:
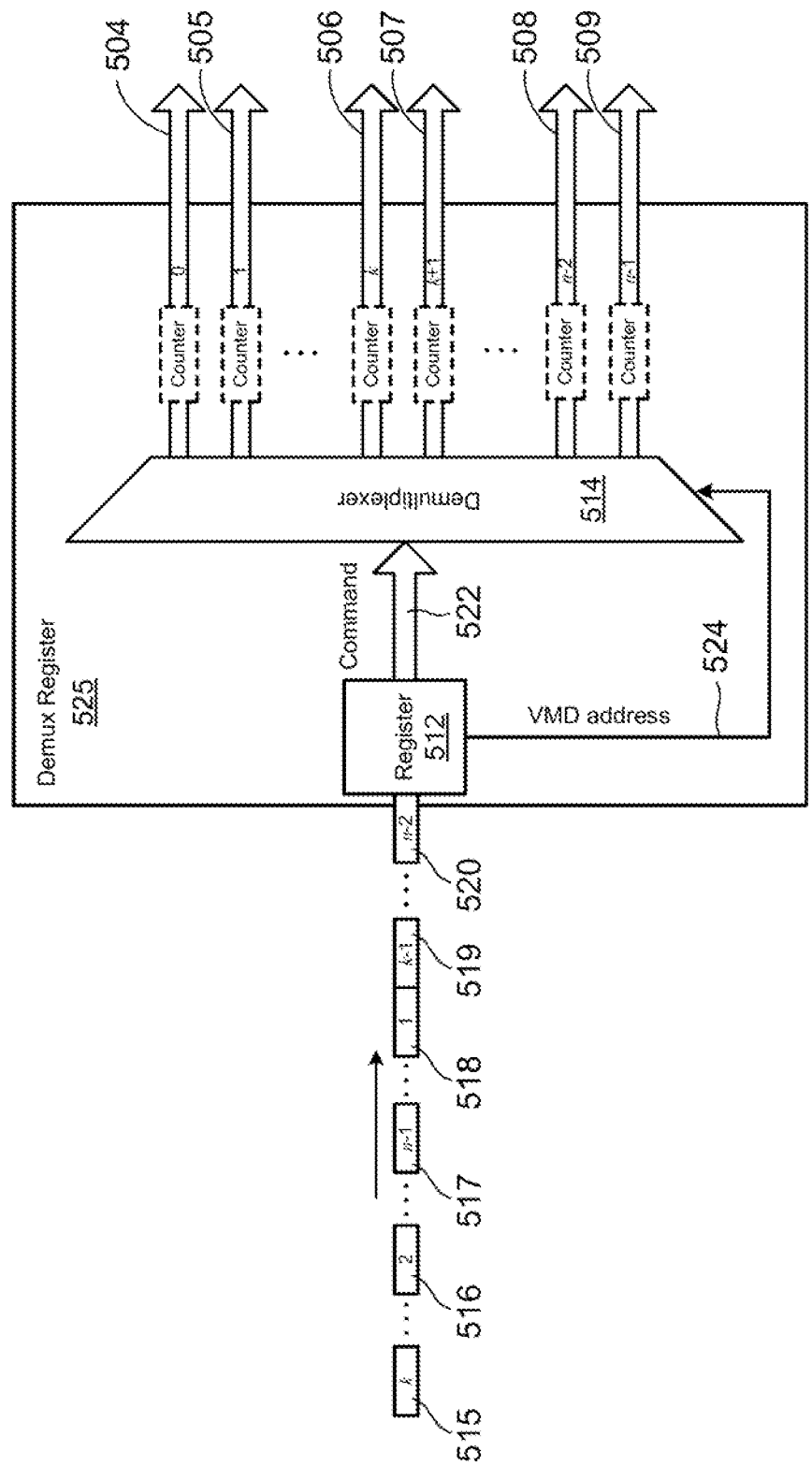

FIG. 5B shows a schematic representation of a first demux register 525 configured in accordance with embodiments of the present invention. The demux register 525 is composed of a register 512 and a demultiplexer 514. The demux register 525 receives commands from the memory controller via the command path 510 of FIG. 5A. The commands are time-division multiplexed. In other words, each command is encoded in a bit stream sent from the memory controller to the demux register 525 in a fixed duration time slot. In FIG. 5B, the time slots of the time-division multiplexed commands are represented by a series of rectangles 515-520. Each of the commands represented in FIG. 5B includes the index of the VMD in FIG. 5A that is intended to receive the command. The order in which the commands are sent to the demux register 525 is determined by the memory controller. Thus, the commands appear in FIG. 5B in that order. Embedded within a command is a control signal identifying the particular kind of operation to be performed, address signals identifying a bank, a row, or a column, and a VMD address identifying a particular VMD assigned by the memory controller to receive the command. For example, when a command is to be sent to a particular VMD, the memory controller creates a command including the VMD address identifying the VMD. In general, the VMD address is a bit string comprising $\log_2 n$ bits.

The register 512 is a buffer that receives and temporarily stores the commands. The demultiplexer 514 includes two inputs. The register sends the command to one input and sends the VMD address to the other input as represented by directional arrows 522 and 524. The demultiplexer 514 uses the VMD address to select the appropriate set of signal lines of the command bus leading to the VMD identified by the VMD address. In FIG. 5B, six of the n sets of signal lines of the command bus are represented by directional arrows 504-

509 corresponding to the sets of signal lines 504-509 and are labeled with the index of the associated VMD shown in FIG. 5A. Note that each command is processed separately by the demux register 525 within a particular time interval before a subsequent command is processed.

Consider, for example with reference to FIGS. 5A-5B, that the memory controller sends command k+1 519 to the $VMD_k$. In FIG. 5A, the command k+1 519 is sent along the command path 510 to the demux register 525. As shown in FIG. 5B, the register 512 receives and temporarily stores the command k+1 519, and the VMD address and the command are sent to the demultiplexer 514, which then selects the appropriate set of signal lines 506 to send the command k+1 519 to the $VMD_{k+1}$ in FIG. 5A. After the command k+1 519 is sent, the next command 1 518 is processed in a similar manner.

As shown in FIG. 5B, the demux register 525 optionally includes counters associated with each set of signal lines. Counters may be needed when the DRAM chips of a VMD cannot support a long burst length associated with a READ or WRITE transaction of a cache line. The demux register partitions the cache line into cache-line segments and translates the command into multiple commands, each command corresponding to a cache-line segment. Thus, each cache-line segment sent to the VMD is preceded by a corresponding command sent by the counter. For example, when the burst length of one or more DRAM chips of a VMD cannot be set long enough to cover a cache line, the counter translates a column-level command such as READ or WRITE into a number of READ/WRITE commands for each cache-line segment so that each cache-line segment can be separately read or written to the DRAM chip. Each counter includes a counting device that keeps track of the number of commands generated for a partitioned cache line. The translation carried out by the counters saves command bandwidth from the memory controller.

Figure 5C:
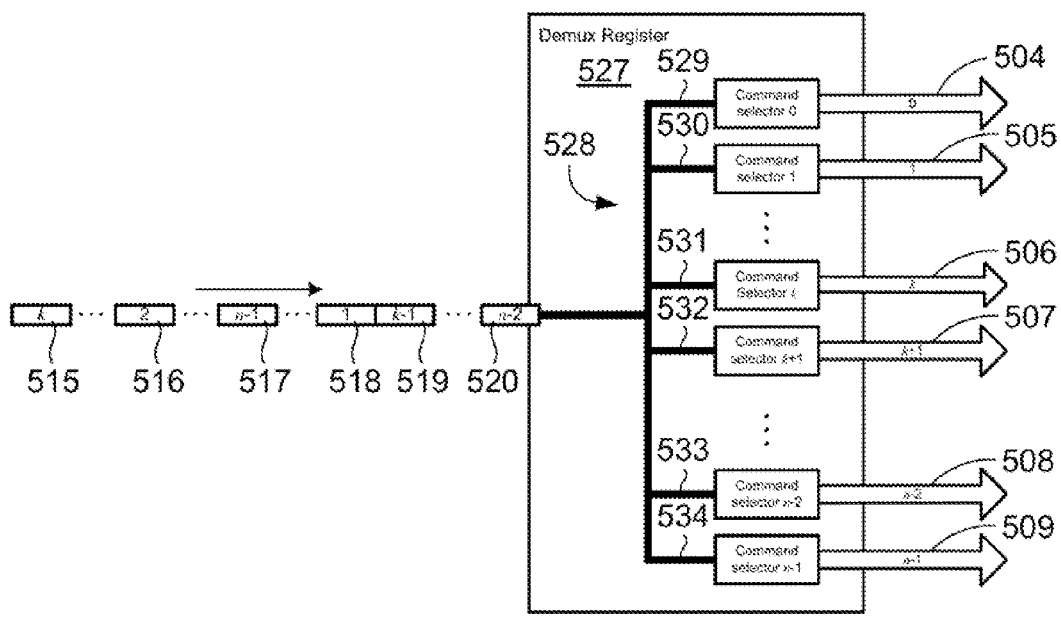

FIG. 5C shows a schematic representation of a second demux register 527 configured in accordance with embodiments of the present invention. The demux register 527 comprises n command selectors denoted 0 through n−1, one command selector for each of the n VMDs shown in FIG. 5A, and a broadcast bus 528. The memory controller sends time-division multiplexed commands 515-520 on the command path 510 to the demux register 527 as described above with reference to FIG. 5B. The command selectors are electronically connected to a broadcast bus 528 via branches 529-534, and each command selector is connected to one of the VMDs via a set of signal lines of the command bus. In FIG. 5C, six of the n sets of signal lines of the command bus are represented by directional arrows 504-509 corresponding to the sets of signal lines 504-509 and are labeled with the index of the associated VMD shown in FIG. 5A. As shown in FIG. 5C, each command is broadcast to all of the n command selectors. Each command selector is configured to extract the VMD address embedded in the command to determine whether the command is to be forwarded on to the corresponding VMD or whether the command is addressed to a different VMD, in which case the command is discarded. Thus, for each command that is broadcast to all n command selectors, the command is only sent by one of the command selectors to a corresponding VMD. For example, the demux register 527 receives and broadcast the command n−2 520 to all n of the command selectors 0 through n−1. However, because the command n−2 520 includes the address of the $VMD_{n-2}$, the command selector n−2 sends the command n−2 520 to the $VMD_{n-2}$ over the set of signal lines 508 and the other command selectors discard the command n−2 520. Note that each command is processed separately by the demux register 527 within a particular time interval before a subsequent command is processed.

Figure 5D:
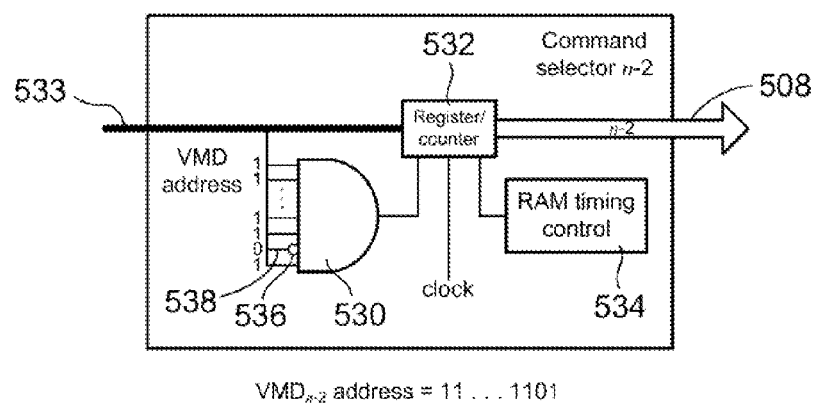

FIG. 5D shows a schematic representation of an exemplary command selector n−2 configured in accordance with embodiments of the present invention. The other n−1 command selectors are analogously configured. The command selector n−2 comprises an AND gate 530, a register/counter 532, and a random access memory ("RAM") timing control 534. Commands are input to the command selector n−1 on the branch 533. The AND gate 530 extracts the VMD address embedded in each command and receives the system clock signal. The AND gate 530 is configured to send a select signal to the register/counter 532 when the extracted VMD address matches the address of corresponding $VMD_{n-2}$. The AND gate 530 receives the clock signal to determine when the register/counter latches the command, and the AND gate 530 can be configured to send the select signal on every rising and/or falling clock edge. The register/counter 532 is a buffer that temporarily stores the command and sends the command to the corresponding $VMD_{n-2}$ when the select signal is received from the AND gate 530. The register/counter 532 also includes a counter that performs cache line and command partitioning as described above with reference to FIG. 5B. The RAM timing control 534 controls the counter portion of the register/counter 532.

In general, an AND gate outputs a signal corresponding to the bit "1" when all of the inputs signals correspond to the bit "1" and outputs a signal corresponding to the bit "0" when at least one of the input signals corresponds to the bit "0," where bits "1" and "0" can represent high and low voltages of a signal, respectively. The AND gates of the command selectors 0 through n−1 may include inverters on certain input signal lines. An inverter converts a signal associated with the bit "0" into a signal associated with the bit "1" and vice-versa. The AND gates include inverters on certain input signal lines in order to convert the VMD address representing the corresponding VMD into a bit stream comprising all "1" bits. The AND gate then outputs a select signal corresponding to the bit "1" to the register/counter 532. For example, assume the VMD address of the $VMD_{n-2}$ comprises a bit stream 11 . . . 1101. The AND gate 530 includes an inverter 536 that inverts the voltage of the signal entering the AND gate 530 on line 538. Thus, as shown in FIG. 5D, when the VMD address embedded in a command matches the address 11 . . . 1101, the address is converted to 11 . . . 1111, and the AND gate 530 in combination with the clock signal outputs the select signal representing the bit "1" to the register/counter 532, which latches the command onto the set of signal lines 508. For other addresses, the bit stream entering the AND gate 530 includes at least one "0" bit and AND gate 530 outputs no signal or a low signal corresponding to the bit "0." Thus, the register/counter 532 does not latch the command onto the set of signal lines 508.

Figure 6:
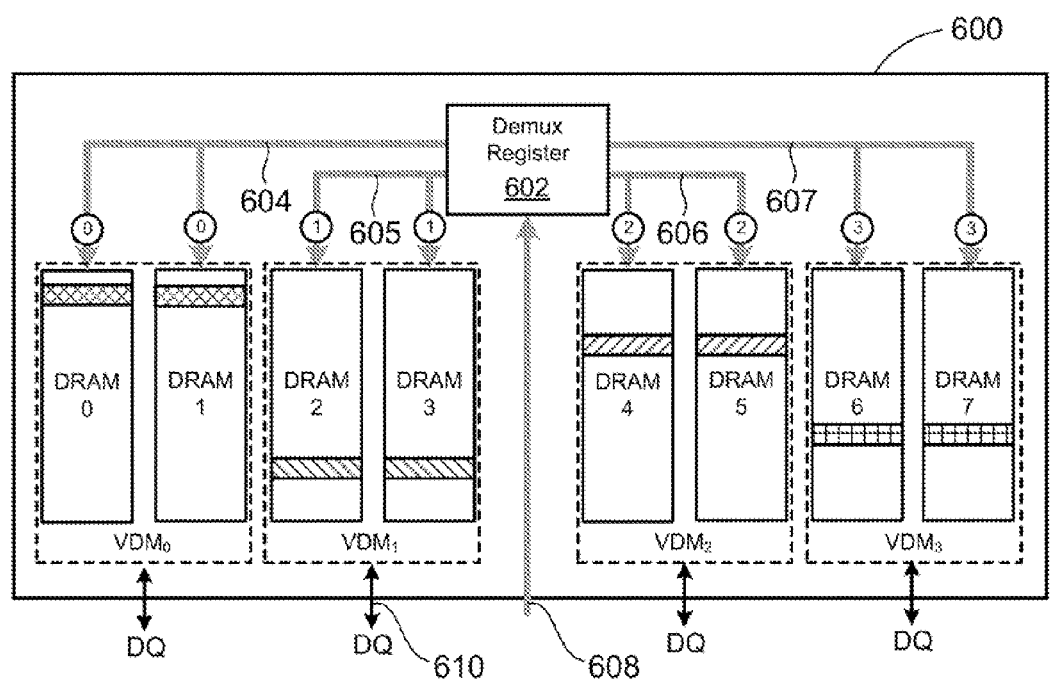
FIG. 6 shows a schematic representation of an exemplary multi-core, dual in-line memory module configured in accordance with embodiments of the present invention.

FIG. 6A shows schematic representation of a MCDIMM 600 configured in accordance with embodiments of the present invention. The MCDIMM 600 includes 4 VMDs identified by $VMD_k$, where k is an integer ranging from 0 to 3, and demux register 602. Each of the VMD's comprises two DRAM chips, and the demux register 602 can be configured and operated as described above with reference to FIGS. 5B-5D. The command bus MCDIMM 600 comprises four sets of signal lines 604-607 connecting the DRAM chips of each of the VMDs to the demux register 602. Commands are sent to the demux register 602 from a memory controller (not shown) along a command path 608. According to $\log_2 n$, where n is equal to 4, the VMDs can be assigned one of the two bit VMD addresses 00, 01, 10, and 11 which are included in the command to identify the VMDs intended to receive the command. Each of the VMDs receives different commands through the command bus and transfers data independent of other VMDs via its own data bus, represented by double headed arrows, such as double headed arrow 610.

In the example MCDIMM 600 of FIGS. 6A-6B, two DRAM chips are involved per memory request. Identically shaded regions of the pairs of DRAM chips represent different independent memory requests associated with different commands. Each VMD receives a command through the command bus and independently transfers data using its own data bus. Thus energy is saved by activating fewer bits than a conventional DIMM (see description accompanying FIG. 3). However, more time may be needed to deliver the data than a conventional DIMM since the data bus sizes are smaller than the data bus sizes in convention DIMMs. For example, the data may be partitioned into smaller serialized data portions, where each portion is sent separately over a VMD bus to the memory controller. Serializing the data in this manner increases the amount of time needed to send the data using a conventional DIMM. This additional serialization latency problem may have a negative impact on system performance.

Method Embodiments of the Present Invention

Method embodiments of the present are described below with reference to dynamically changing the energy consumption of individual VMDs of a MCDIMM. Memory chips can enter a number of different operation modes. For example, a memory chip can enter an active mode in response to a memory request. When the memory chip is no longer handling the memory request, the memory chip can enter a standby mode where the memory chip is provided standby energy, which is lower than the energy needed to actively handle a memory request but high enough to maintain operation of internal memory-chip components enabling the memory chip to quickly respond to another memory request. However, when there are multiple memory modules per memory channel, the memory chips in standby mode consume a significant portion of the total energy sent to the memory modules.

Standby energy can be saved by entering memory chips that are temporarily not in use into an energy-saving mode. A memory chip in an energy-saving mode has to be powered up, which increases response time. For example, a power-down mode is an energy-saving mode that saves energy by turning off a number of internal memory-chip components, however there are a number of performance limitations associated with this mode. Normal memory chip access is not possible while the memory chip is in the power-down mode, and the memory chips have to be powered up, so it takes more time to enter and exit the power-down mode than it does to enter and exit the standby mode. As a result, using a power-down mode typically saves energy but leads to lower memory-system performance. In order to reduce the time needed to power up memory chips, many memory chips can also be configured with multiple power-down modes. Each power-down mode provides a different incremental level of energy savings. However, each incremental increase in energy savings corresponds to a longer amount of time needed to power up the memory chip.

Figure 7:
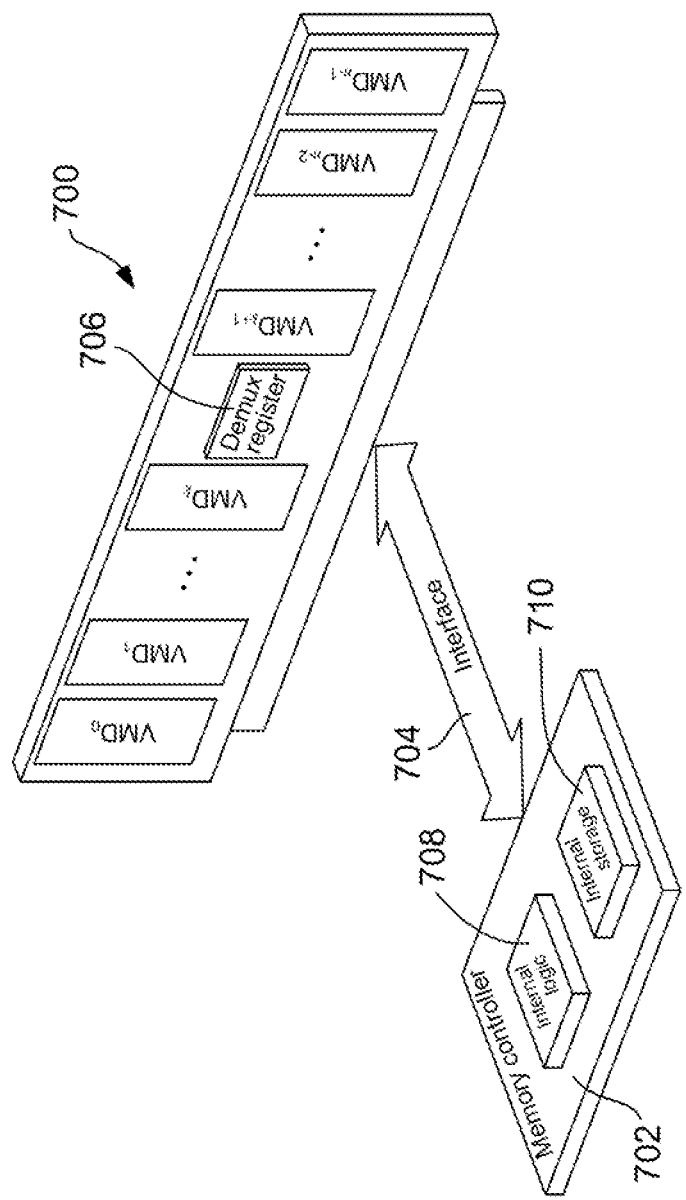
FIG. 7 shows a multi-core dual in-line memory module electronically connected to a memory controller in accordance with embodiments of the present invention.

Method embodiments of the present invention can be transparent to one or more applications running on a multicore processor because the decision to pick an operation mode can be made entirely by hardware, which also has the flexibility of being modified by compilers or by one or more of the applications during runtime. FIG. 7 shows a MCDIMM 700 electronically connected to memory controller 702 via an interface 704 in accordance with embodiments of the present invention. The MCDIMM 700 comprises a demux register 706 and n VMDs configured as described above with reference to FIG. 5A. As shown in FIG. 7, the memory controller 702 is configured with internal logic 708 and internal storage 710. Information regarding the usage of each VMD can be stored in the internal storage 710 and methods of the present invention can be executed entirely by the memory controller internal logic 708.

Method embodiments include optimizing the performance and/or energy efficiency of memory modules during runtime of one or more applications running on a multicore processor. A computer system operator, one or more of the applications, or the operating system selects a metric that provides a standard by which the performance and/or energy efficiency of the memory modules is optimized. The metric can be the minimum total execution time ("TET"), the minimum total energy consumption ("TEC"), the minimum energy-delay product ("EDP"), or any other suitable standard by which performance and/or energy efficiency of the memory modules can be optimized. Setting the metric to minimizing the TET of one or more applications allows the applications nearly full bandwidth access to the storage capacity provided by the memory modules. In other words, when memory chips are not actively handling a memory request, rather than entering the memory chips into a power-down mode, the memory chips are entered into standby mode so that the memory chips can quickly respond to the next memory request. Thus, TET is a performance metric. On the other hand, setting the metric to TEC reduces the number of a readily available memory chips for each memory request by entering these memory chips into an energy-saving mode, which decreases the bandwidth and delays the memory response time but provides an energy savings over setting the metric to TET. Setting the metric to minimizing EDP provides a compromise between TET and TEC. The EDP metric is defined as the product of energy and delay associated with a memory request. The EDP can be used to provide the minimum energy at a given performance level, or more performance for the same energy.

Once a metric has been selected, information regarding the usage of each VMD during the running of the one or more applications is determined. Usage information is collected and stored in the memory controller 702 and can include one or more of the following: (1) a record of the frequency of memory requests per VMD when the memory controller receives a sufficient number of memory request over a period of time; (2) a ratio of the number of memory requests and the number of instructions executed over a period of time; (3) a penalty assigned to choosing one operation mode over another; (4) a compiler can provide the memory controller 702 with information regarding the frequency of memory accesses per VMD associated with one or more applications it processes; and (5) one or more applications at runtime can provide the memory controller 702 with a history of the frequency of memory accesses per VMD.

The memory controller compares the usage information for each VMD with one or more thresholds and enters a VMD into a corresponding operation mode by sending an appropriate command to the VMD. For example, when the usage information associated with a VMD is less than a threshold, the memory controller enters the VMD into a corresponding power-down mode, and when the usage information associated with the VMD is greater than the threshold, the memory controller enters the VMD into standby mode. The thresholds are selected in accordance with the metric selected for optimizing use of the memory modules. For example, embodiments of the present invention include that when the metric is set to TET, the energy-saving modes can be bypassed or the thresholds can be set low so that few VMDs enter an energy-saving mode. On the other hand, by setting the metric to either TEC or EDP, the thresholds are relatively higher than the thresholds associated with TET enabling a number of VMDs to enter energy-saving modes.

Embodiments of the present invention also include one or more of the applications running on a multicore processor or a compiler providing characteristic information regarding the amount of memory needed or memory access pattern of the one or more applications to the memory controller. The characteristic information and the metric are sent to the memory controller via a runtime system, such as an operating system or a virtual machine, which is a software implementation of a computer that executes one or more applications like a real computer. The runtime system interprets the metric and the characteristic information for the memory controller and can direct the memory controller to select an appropriate operation mode for the applications. For example, suppose a system operator selects the EDP metric with multiple applications running concurrently in cores of a multicore processor, where the characteristic information provided by the applications authors or compilers identify most of the applications as frequent-memory-access applications. As a result, the runtime system can direct the memory controller to configure the MCDIMMs to not use the power-down modes without collecting statistical information regarding the number of memory accesses. Also, a hypervisor or other element of a runtime system that schedules, monitors, and supports a running application can direct the memory controller to configured the MCDIMMs.

FIG. 8A shows a bar graph 800 presenting usage information for each of the VMDs of the MCDIMM 700 in accordance with embodiments of the present invention. Each bar of the graph 800 can represent the frequency or number of times a VMD of the MCDIMM 700 is accessed over a period of time. The graph 800 includes three dashed lines 801-803 representing thresholds $T_1$, $T_2$, and $T_{max}$, respectively. The thresholds are also associated with three different power-down modes $PDM_1$, $PDM_2$, and $PDM_{max}$. $PDM_{max}$ saves more power than $PDM_1$ and $PDM_2$ by turning off the largest number of internal memory chips components, but requires the longest delay time to power up; $PDM_1$ offers the least energy savings by turning off the fewest internal memory chip components, but requires the shortest delay time to power up; and $PDM_2$ offers an energy savings between $PDM_{max}$ and $PDM_1$ and requires an intermediate delay time to power up.

Thresholds $T_1$, $T_2$, and $T_{max}$ 801-803, shown in FIG. 8A, can represent thresholds determined by setting the metric to either TEC or EDP. The thresholds represent a balance between acceptable performance and energy efficiency. For example, the bar graph 800 reveals $VMD_0$, $VMD_2$, $VMD_k$, $VMD_{k+1}$, and $VMD_{k-2}$ all have usage information in excess of the threshold $T_1$. In other words, the memory controller uses these VMDs often while one or more applications are running. Thus, rather than entering these VMDs into one of the energy-saving modes, the memory controller enters them into standby mode when they are not actively handling a memory request. On the other hand, as shown in FIG. 8B, the usage information associated with $VMD_1$ is less than the $T_{max}$, the usage information associated with $VMD_{n-3}$ is greater than $T_{max}$ and less than $T_2$, and the usage information associated with $VMD_{n-1}$ is greater than $T_2$ and less than $T_1$. Thus, in order to save energy, the memory controllers enters the $VMD_1$ into $PDM_{max}$, enters the $VMD_{n-3}$ into $PDM_2$, and enters the $VMD_{n-1}$ into $PDM_1$ until $VMD_1$, $VMD_{n-3}$, and $VMD_{n-1}$ are powered up to respond to a memory request.

Figure 9A:
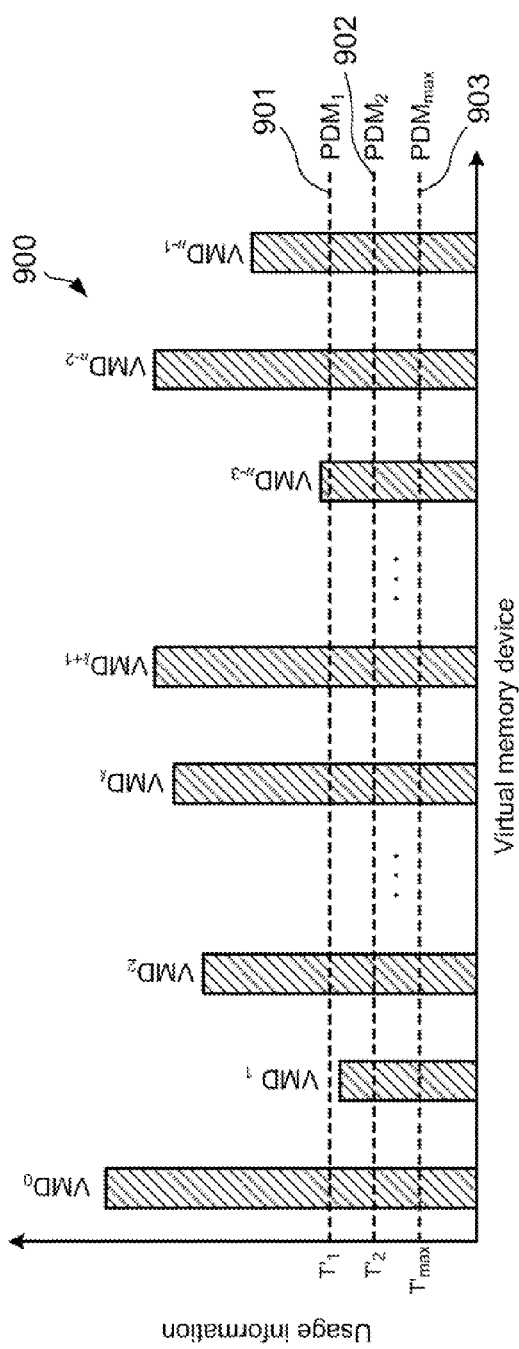
FIG. 9A shows the bar graph shown in FIG. 8A with threshold adjusted in accordance with optimizing total execution time of the multi-core dual in-line memory modules shown in FIG. 7 in accordance with embodiments of the present invention.

FIG. 9A shows the bar graph 800 representing the usage information for each of the VMDs of the MCDIMM 700 shown in FIG. 8A, but the thresholds are changed in accordance with setting the metric to TET. Note that the bars representing the usage information associated with each of the VMDs is unchanged from that shown in FIG. 8A. However, because the metric has been changed to TET, thresholds $T_1$, $T_2$, and $T_{max}$ represented in FIG. 8A are changed to thresholds $T'_1$, $T'_2$, and $T'_{max}$ represented in FIG. 9A by dashed lines 901-903. In this particular example, performance outweighs energy efficiency. Thus, FIG. 9A reveals that only one VMD falls below a threshold. In particular, the usage information associated with $VMD_1$ is greater than the threshold $T'_2$ and less than the threshold $T'_1$. The memory controller enters the $VMD_1$ into the power-down mode $PDM_1$ for a period of time until $VMD_1$ is powered up for a memory request. The memory controller enters the remaining VMDs into standby mode when these VMDs are not actively handling a memory request.

In certain embodiments, the memory controller can select which operation mode to use. In certain embodiments, when the memory is heavily used or performance is more critical, the memory controller does not use the energy-saving modes.

Method embodiments are dynamic because usage information can be regularly collected by the memory controller and the usage information associated with each of the VMDs updated while one or more applications are running. As a result, the VMDs can be regularly switched into different operation modes while the one or more applications are running based on current usage information without disabling memory access. In addition, in certain embodiments, the metric can also be changed by a computer system operator while one or more applications are running.

Figure 9B:
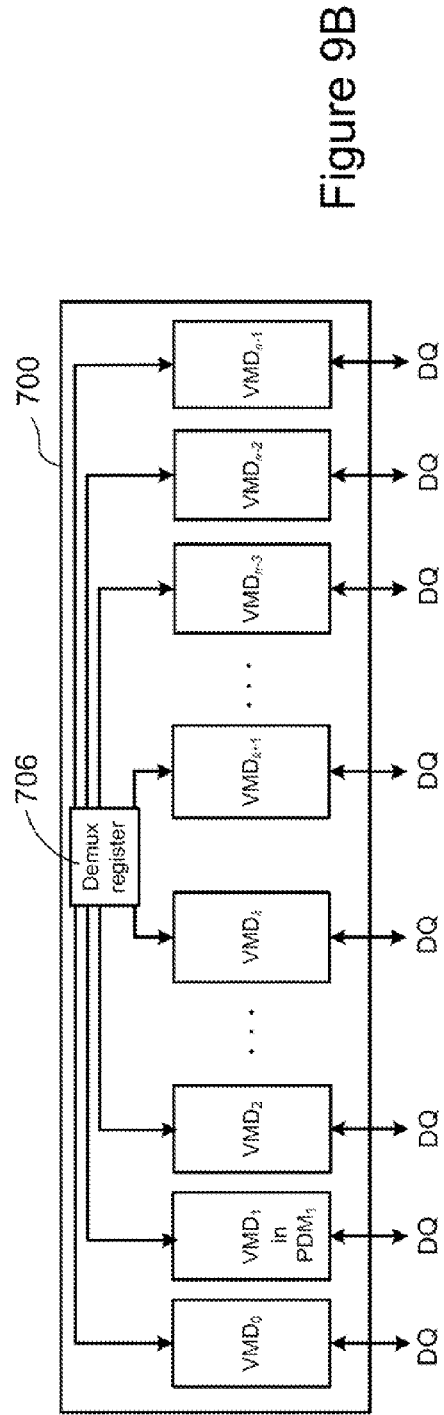
FIG. 9B shows one virtual memory device of the multi-core dual in-line memory module shown in FIG. 7 in an energy-saving mode in accordance with embodiments of the present invention.
Figure 10:
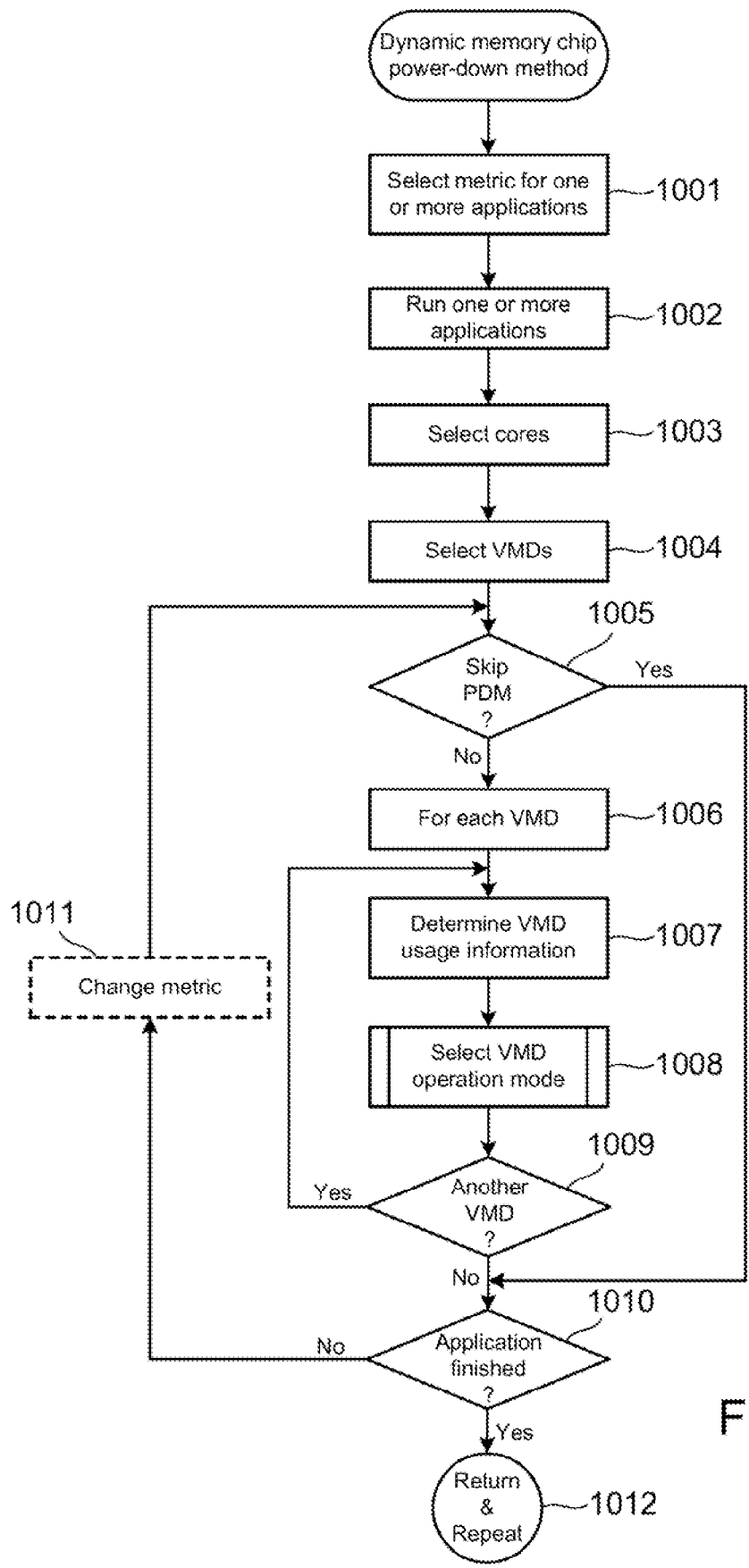
FIG. 10 shows a control-flow diagram of a method for dynamically entering virtual memory devices of memory modules into power-down modes in accordance with embodiments of the present invention.

FIG. 10 shows a control-flow diagram of a method for dynamically entering VMDs of memory modules into operation modes in accordance with embodiments of the present invention. In step 1001, a metric, such as the metrics TET, TEC, or EDP, is selected to optimize memory performance and/or energy consumption associated with running one or more applications. The metric can be selected by a computer system operator, one or more of the applications, or the operating system, as described above. In step 1002, one or more of the applications are executed. In step 1003, the operating system selects one or more cores to process the one or more applications. In step 1004, based on the memory requirements of the one or more applications, the operating system selects one or more VMDs of the MCDIMMs. In step 1005, in accordance with the metric and/or characteristic information supplied by the application itself, a runtime system can direct the memory controller to step 1006 and enter the energy-saving portion of the method carried out in steps 1006-1009. Otherwise, the runtime system can direct the memory controller to skip the energy saving portion of the method. For example, when the characteristic information provided by the one or more applications identifies the applications as frequent-memory-access applications, the runtime system can direct the memory controller to skip the energy-saving portion of the method carried in steps 1006-1009. In the for-loop of step 1006, steps 1007-1008 are executed for each of the VMDs of the memory module. In step 1007, the memory controller collects and stores VMD usage information over a period of time, as described above with reference to FIG. 7. In step 1008, the memory controller enters the VMD into an operation mode based on the metric and usage information, as described below in the control-flow diagram of FIG. 11. For example, when the VMD is not actively handling a memory request, the memory controller can enter the VMD into standby mode or one of many energy-saving modes, as described above with reference to FIGS. 8-9. In step 1009, when all of the VMDs are entered into an operation mode proceed to step 1010, otherwise steps 1007 and 1008 are repeated for another VMD. In step 1010, when the running of the one or more applications is not finished, embodiments of the present invention can optionally include the step 1011, otherwise when the one or more applications are finished running, proceed to step 1012 where steps 1001-1009 are repeated for a different set of one or more applications or a subsequent running of the same set of one or more applications. In step 1011, while the one or more applications are still running, the computer system operator can change the metric. For example, the computer system operator can initially set the metric in step 1001 to TET, and, at a later time while the one or more applications are running change the metric to TEC.

Figure 11:
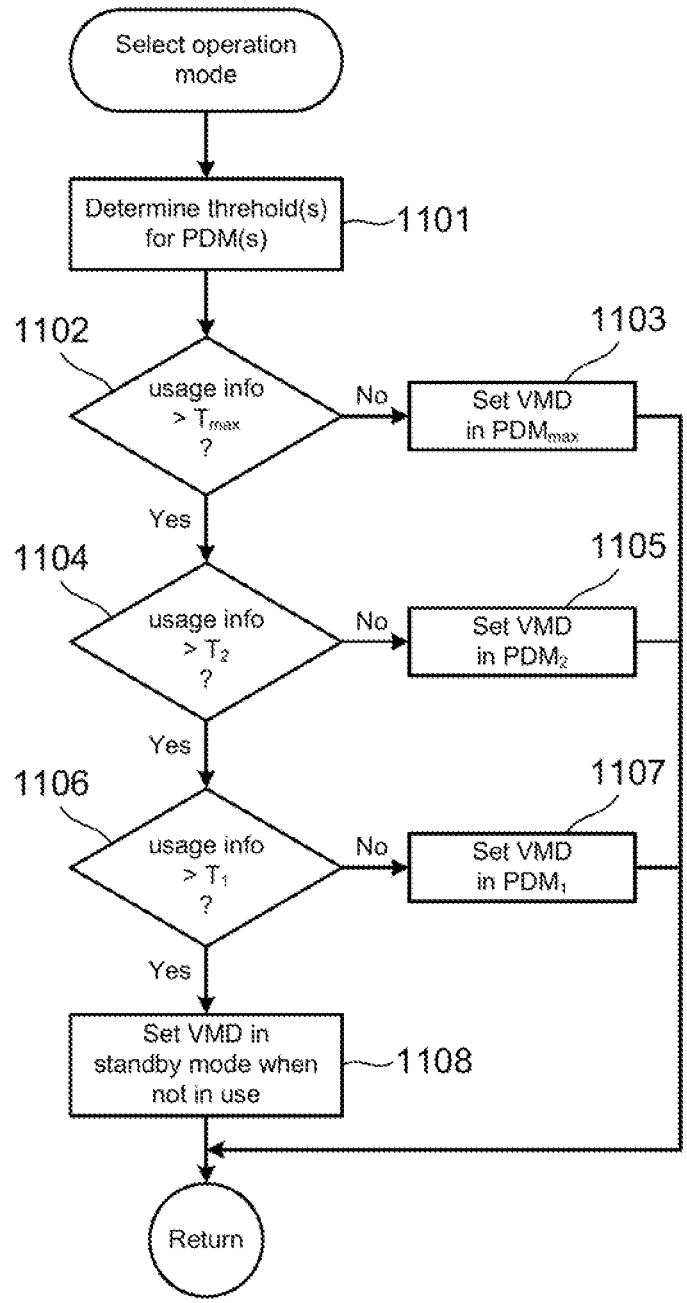
FIG. 11 shows a control-flow diagram of a subroutine of the method of FIG. 10A in accordance with embodiments of the present invention.

FIG. 11 shows a control-flow diagram of a method for dynamically entering VMDs into power-down modes in accordance with embodiments of the present invention. In this embodiment, the memory chips are assumed to have three energy-saving power-down modes represented in steps 1103, 1105, and 1107, as described above with reference to FIGS. 8-9. In step 1101, threshold values corresponding to three power-down modes are determined based on the metric selected in step 1001 of FIG. 10, as described above with reference to FIGS. 8-9. The memory controller uses the usage information collected and stored in step 1006 of FIG. 10 to select one or three power-down mode in steps 1102-1107. The power-down modes are $PDM_1$, $PDM_2$, and $PDM_{max}$ described above with reference to FIG. 8A. In step 1102, when the usage information is less than a threshold $T_{max}$, proceed to step 1103, otherwise proceed to step 1104. In step 1103, the memory controller enters the VMD into $PDM_{max}$. In step 1104, when the usage information is less than a threshold $T_2$, proceed to step 1105, otherwise proceed to step 1106. In step 1105, the memory controller enters the VMD into $PDM_2$. In step 1106, when the usage information is less than a threshold $T_1$, proceed to step 1107, otherwise proceed to step 1108. In step 1107, the memory controller enters the VMD into $PDM_1$. In step 1108, the memory controller enters the VMD into standby mode. In other embodiments, the memory chips can be configured with one, two, or four or more different power-down modes.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A method for determining an operation mode for each virtual memory device of a memory module comprising:
    selecting a metric that provides a standard by which performance and/or energy efficiency of the memory module is optimized during execution of one or more applications on a multicore processor; and
    for each virtual memory device:
        collecting usage information associated with the virtual memory device over a period of time;
        determining an operation mode for the virtual memory device based on the metric and usage information; and
        entering the virtual memory device into the operation mode.

2. The method of claim 1 wherein the metric further comprises at least one of minimum total execution time, minimum total energy consumption, and minimum energy-delay product.

3. The method of claim 1 wherein selecting the metric to be minimum total execution further comprises repeating the steps of claim 1 for a different period of time.

4. The method of claim 1 further comprising:
    changing the metric during execution of the one or more applications; and
    via a runtime system:
        receiving the metric and characteristic information regarding an amount of memory needed or memory access pattern of the one or more applications, interpreting the metric and characteristic information, and directing a memory controller to enter each virtual memory device into an appropriate operation mode.

5. The method of claim 1 wherein the usage information further comprises determining one or more of:
    a frequency of memory requests when a memory controller receives a sufficient number of memory requests over the period of time;
    a ratio of a number of memory requests and a number of instructions executed over the period of time;
    a penalty assigned to choosing one operation mode over another;
    a frequency of memory accesses associated with an application provided by a compiler to the memory controller; and
    a frequency of memory accesses determine by an application at runtime and sent to the memory controller.

6. The method of claim 1 wherein selecting the metric further comprises one of:
    a computer system operator selecting the metric;
    one or more applications programmed to select the metric;
    an operating system selecting the metric; and
    a hypervisor or other element of a runtime system that schedules, monitors, and supports a running application.

7. The method of claim 1 wherein collecting usage information further comprises a memory controller storing a number of times the virtual memory device is accessed over the period of time.

8. The method of claim 1 wherein determining an operation mode for the virtual memory device further comprises:
    determining at least one threshold based on the metric; and
    comparing the usage information to the at least one threshold, wherein when the usage information is greater than the at least one threshold, the virtual memory device is entered into standby mode otherwise the virtual memory device is entered in an energy-saving mode.

9. The method of claim 8 wherein when the energy-saving mode further comprises at least one power-down mode, each power-down mode is associated with one of the at least one threshold.

10. The method of claim 9 wherein when the usage information is greater than a first threshold and less than a second threshold, the virtual memory device is entered into the power-down mode associated with the second threshold.

11. The method of claim 1 wherein the operation mode further comprises a standby mode when the virtual memory device is not handling a memory request and performance of the memory module is higher priority than saving energy.

12. A system comprising:
a memory controller; and
a memory module comprising at least one virtual memory device and a demultiplexer register connected to each virtual memory device and the memory controller, wherein the memory controller enters at least one virtual memory device into an operation mode based on a metric and the level of usage information collected over a period of time.

13. The system of claim 12 wherein the virtual memory device further comprises one or more memory chips.

14. The system of claim 12 wherein the metric further comprises minimum total execution time, minimum total energy consumption, minimum energy-delay product, or another suitable standard by which performance and/or energy efficiency of the memory module can be optimized.

15. The system of claim 12 wherein the operation mode further comprises one of:
an energy-saving mode; and
a standby mode.

* * * * *